(12) United States Patent
Lin

(10) Patent No.: US 6,642,116 B2
(45) Date of Patent: Nov. 4, 2003

(54) METHOD FOR FABRICATING A SPLIT GATE FLASH MEMORY CELL

(75) Inventor: Chi-Hui Lin, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/191,108

(22) Filed: Jul. 8, 2002

(65) Prior Publication Data
US 2003/0049904 A1 Mar. 13, 2003

(30) Foreign Application Priority Data
Sep. 13, 2001 (TW) ..................... 90122689 A

(51) Int. Cl.⁷ ............................. H01L 21/336
(52) U.S. Cl. .................... 438/286; 438/257
(58) Field of Search ................. 438/286, 257

(56) References Cited
U.S. PATENT DOCUMENTS
2002/0142543 A1 * 10/2002 Lin et al. .............. 438/257

* cited by examiner

Primary Examiner—Richard Elms
Assistant Examiner—Beth E. Owens
(74) Attorney, Agent, or Firm—Merchant & Gould P.C.

(57) ABSTRACT

A method of fabricating flash memory cell is described. The method includes the steps of providing a semiconductor substrate; forming a first gate insulating layer; forming a first conductive layer; forming a buffer layer; removing portions of the buffer layer to farm a floating gate insulating layer; forming a second conductive layer; removing portions of the first conductive layer and the second conductive layer, such that the second conductive layer forms conductive spacers having conductive tips situated at the tips, and the floating gate insulating layer, the floating gate and the first gate insulating layer are combined as a floating gate region; forming a second insulating layer; forming a third conductive layer; removing portions of the third conductive layer and the second insulating layer to form a control gate, a second gate insulating layer, a first opening and a second opening; forming a source region on the substrate; forming spacers; and forming a drain region on the substrate.

14 Claims, 9 Drawing Sheets

METHOD FOR FABRICATING A SPLIT GATE FLASH MEMORY CELL

BACKGROUND OF THE INVENTION

1. Field of the Invention

The present invention relates to a memory device, and more particularly to the fabrication of a split gate memory cell of a flash memory.

2. Description of the Prior Art

Complementary metal-oxide-semiconductor (CMOS) memory can be divided into two main categories: random access memory (RAM) and read-only memory (ROM). ROM's market share has been continuously growing in the past few years, and further growth in the near future is foreseen, especially for flash memory in which a single cell can be electrically programmable and a block, sector or page of cells that are electrically erasable at the same time. Due to the flexibility of flash memory against electrically programmable read-only memory (EPROM), electrically programmable but erasable via ultraviolet exposure, the market share of flash memory is also experiencing rapid growth. Electrically erasable and programmable read-only memory (EEPROM), electrically erasable and programmable per single byte, will be manufactured for specific applications only, since they use larger area and are more expensive. In recent years, flash memory has found interesting applications in electrical consumer products such as: digital cameras, digital video cameras, cellular phones, laptop computers, mobile MP3 players, and Personal Digital Assistants (PDA's). Since portability of these electrical consumer products is strongly prioritized by consumers, the products' size must be minimal. As a result, the capacity of the flash memory must be enlarged, and functions have to be maximized while size is reduced. The capacity of flash memory has increased from 4 to 256 MB, and will increase to even 1 GB in the near future. With the increase in packing density for flash memory, floating gates and control gates have to be made as small as possible. In conventional processes, masks are usually used to define the gates in flash memory. FIGS. 1A to 1G show the manufacturing processes of a conventional split gate flash memory device.

As shown in FIG. 1A, a semiconductor substrate 100 is provided. An LOCOS Oxidation process is performed to form a field insulating layer (not shown) on the substrate 100. The field insulating layer isolates each active area. A first insulating layer 110 is formed on the substrate 100 within the active area. The first insulating layer 110 can be made of oxide formed by oxidation and has a thickness of from 50 to 200 angstroms. Then, a first conductive layer 115, which has a thickness of about 100 to 2000 angstroms, is formed on the first insulating layer 110. The first conductive layer 115 is usually made of doped polycrystalline silicon formed by chemical vapor deposition (CVD) process. Then, a first masking layer 120, with a thickness of about 500 to 2000 angstroms, is formed on the first conductive layer 115 by depositing a silicon nitride layer.

As shown in FIG. 1B, a portion of the first masking layer 120 is removed by performing photolithography and etching process to define the first opening 125 and to expose the surface of the first conductive layer 115.

As shown in FIG. 1C, a floating gate insulating layer 130 is formed on the exposed surface of the first conductive layer 115 by an oxidation process.

After oxidation, as shown in FIG. 1D, the first masking layer 120 is removed by performing an etching process.

Then, using the floating gate insulating layer 130 as a hard mask, a portion of the first conductive layer 115 and the first insulating layer 110 are sequentially removed to expose the surface of the substrate 100 by an etching process. The portions of the first conductive layer 115 and the first insulating layer 110 under the floating gate insulating layer 130 remain. The remaining first conductive layer 115 forms a floating gate 136. The remaining first insulating layer 110 will be expressed as a first gate insulating layer 112. Conductive tips 138 situated at the edge of the floating gate 136 are used for tip discharging when flash memory is erasing. Then, a second insulating layer 132 is formed on the surface of the substrate 100, the oxide layer 130, the floating gate 136 and the first gate insulating layer 112. The second insulating layer 132, which has a thickness of about 50 to 250 angstroms, is an oxide and is formed by oxidation or CVD.

As shown in FIG. 1E, a second conductive layer 135 is formed on the second insulating layer 132. The second conductive layer 135 has a thickness of about 1000 to 2000 angstroms and is usually made of the doped polycrystalline silicon formed by CVD.

As shown in FIG. 1F, portions of the second conductive layer 135 and the second insulating layer 132 are removed by photolithography and etching to form a second opening 142 and a third opening 144. The remaining second conductive layer 135 forms the control gate 170. The remaining second insulating layer 132 will be expressed as a second gate insulating layer 155.

As shown in FIG. 1G, a source region 180 is formed on the exposed substrate 100 by implanting N-type ions, such as phosphorus or arsenic into the substrate 100, which is exposed in the second opening 142. Then, an oxide layer (not shown) is formed to cover the surface and the sidewalls of the control gate 170, the surface of the floating gate insulating layer 130, the sidewalls of the second gate insulating layer 155, floating gate 136, and the first gate insulating layer 112. Etching is performed to remove portions of the oxide layer and form the sidewall spacers 150 on the sidewalls of the floating gate 136, the first gate insulating layer 112, the control gate 170 and the second gate insulating layer 155. A drain region 190 is formed on the exposed substrate 100 by implanting N-type ions, such as phosphorus or arsenic into the substrate 100, which is exposed in the third opening 144. The manufacture of a cell of flash memory is thus completed.

The conventional processes for fabricating flash memory usually form a floating gate insulating layer by thermal oxidation on a doped polycrystalline silicon, then use the floating gate insulating layer as a hard mask to etch portions of doped polycrystalline silicon uncovered by the floating gate insulating layer, such that the floating gate is formed. As memory devices become more integrated, the minimization of feature size of flash memory is needed. The sharpness of the floating gate has been limited due to the gate insulating layer formed by oxidizing. Thus, the minimization of the feature size can not be achieved.

SUMMARY OF THE INVENTION

An object according to the present invention is to provide a method of fabricating a split gate flash memory cell with improved feature of the floating gate characterized by minimization of the feature size.

The present invention achieves the above-indicated object by forming a buffer layer on a conductive layer as a floating gate insulating layer. Next, conductive spacers are formed on the sidewalls of the floating gate insulating layer. Then, the residual conductive layer and the conductive spacers are combined as a floating gate. The process for forming the floating gate insulating layer of the present invention is easily controlled. The tips of the conductive spacers are conductive tips. The matured etching process is used to form the conductive spacers, such that the conductive tips of the present invention can be sharper than those of the prior art. Therefore, minimization of the feature size can be achieved.

A method of fabricating a split gate flash memory cell first provides a semiconductor substrate. Defining an active area on the substrate, a first insulating layer is formed within the active area. A first conductive layer is formed on the first insulating layer. Then, a buffer layer is formed on the first conductive layer. Portions of the buffer layer are removed to form a floating gate insulating layer. A second conductive layer is formed on the surface of the first conductive layer and the floating gate insulating layer. Portions of the first conductive layer and the second conductive layer are removed, such that the second conductive layer remaining on the sidewalls of the floating gate insulating layer forms conductive spacers having conductive tips situated at the tips, the first conductive layer remaining under the conductive spacers and the floating gate insulating layer forms a conductive layer, the conductive spacers and the conductive layer are combined as a floating gate, wherein the conductive tips are suitable for tip discharging, and the floating gate insulating layer, the floating gate and the first gate insulating layer are combined as a floating gate region. Next, a second insulating layer is formed on the surface of the floating gate region and the substrate. A third conductive layer is formed on the second insulating layer. Portions of the third conductive layer and the second insulating layer are removed to form a first opening and a second opening. The remaining third conductive layer forms the control gate. The remaining second insulating layer will be expressed as a second gate insulating layer. A source region is formed on the exposed substrate by implanting N-type ions into the substrate, which is exposed in the first opening. Then, sidewall spacers are formed on the sidewalls of the first and the second opening. Finally, a drain region is formed on the exposed substrate, which is exposed in the second opening.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1A:
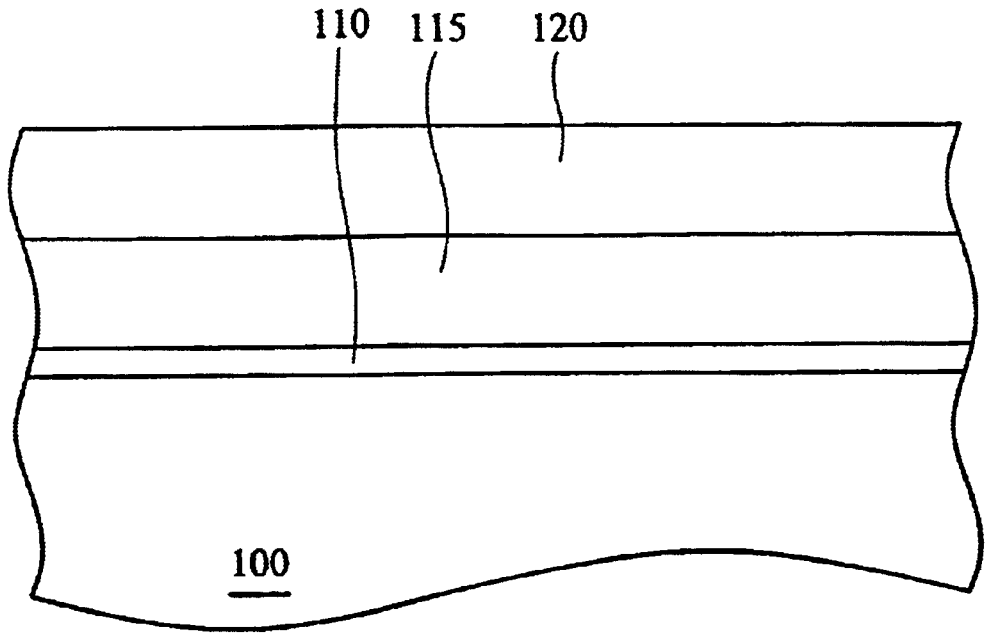
FIGS. 1A through 1G illustrate, in cross section, the process in accordance with a conventional split gate flash memory device.
Figure 1B:
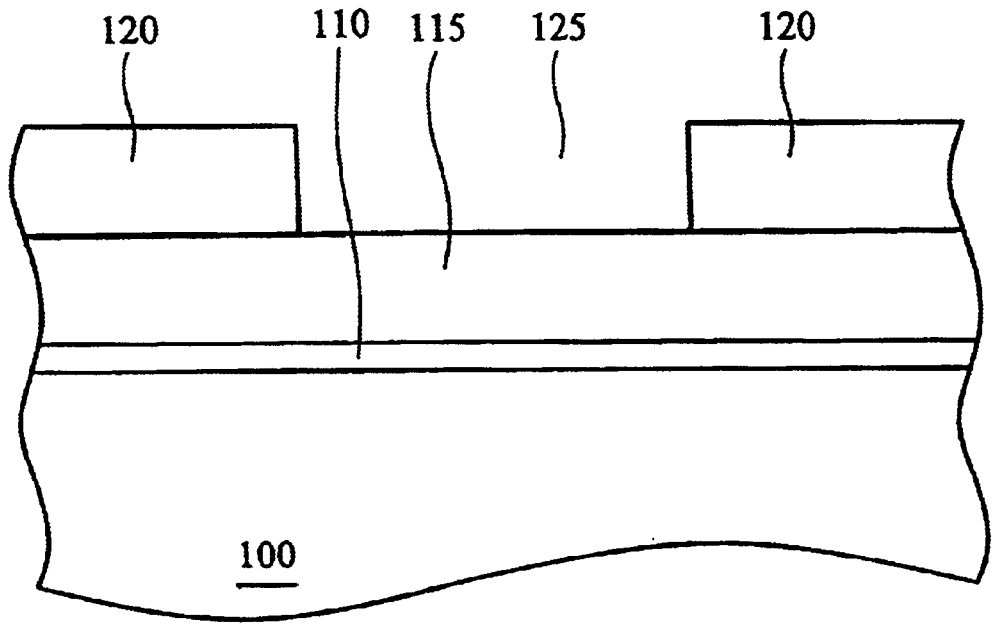
Figure 1C:
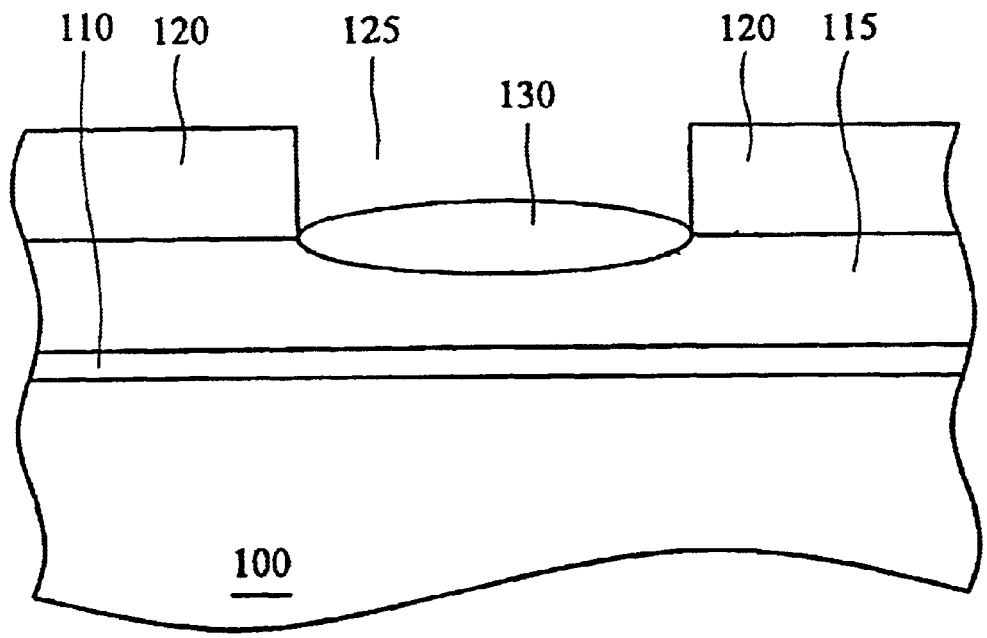
Figure 1D:
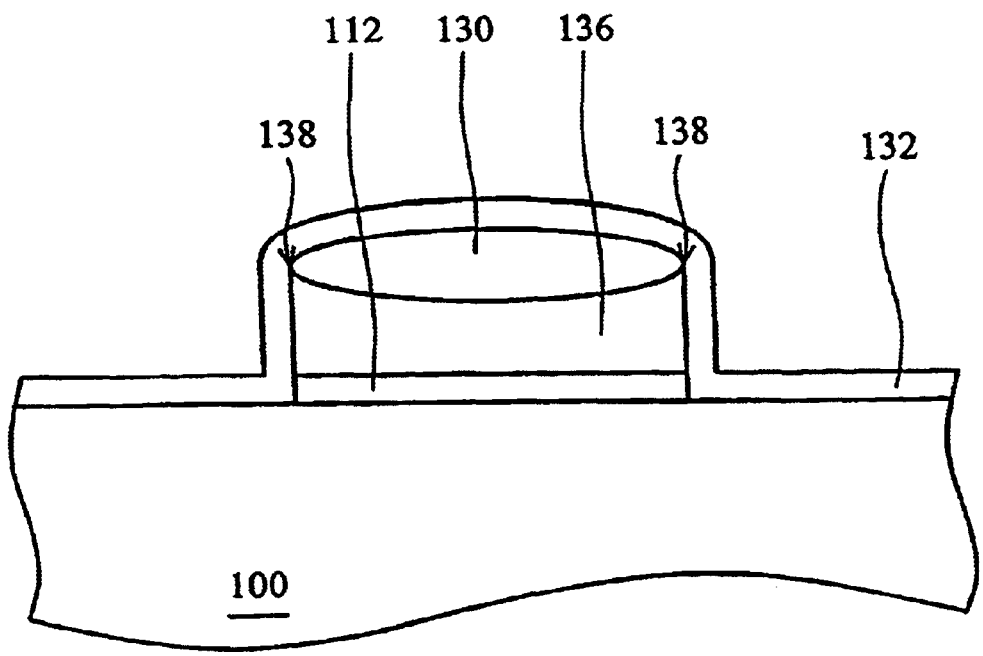
Figure 1E:
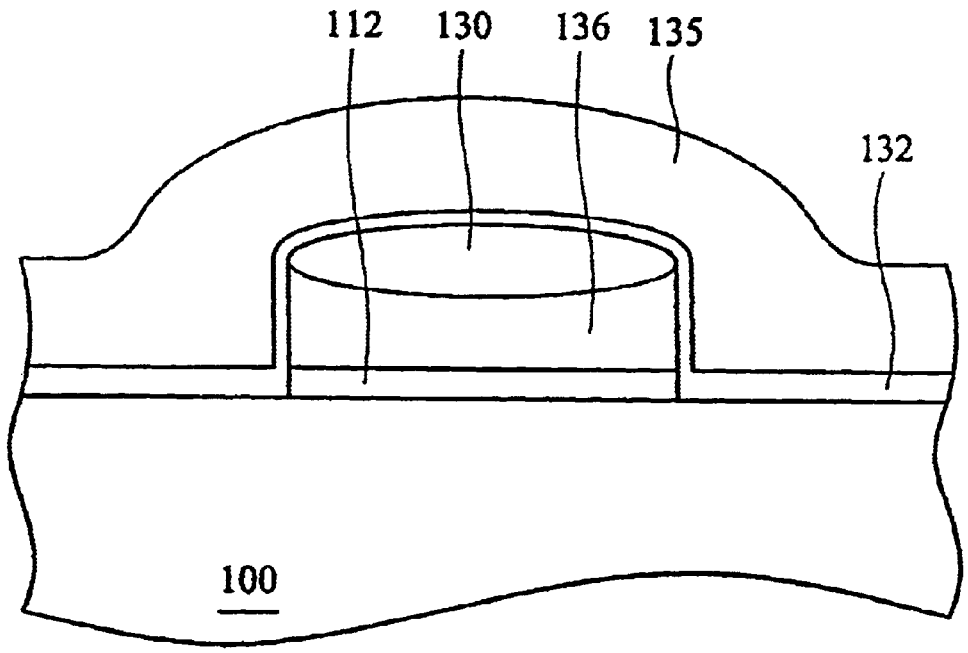
Figure 1F:
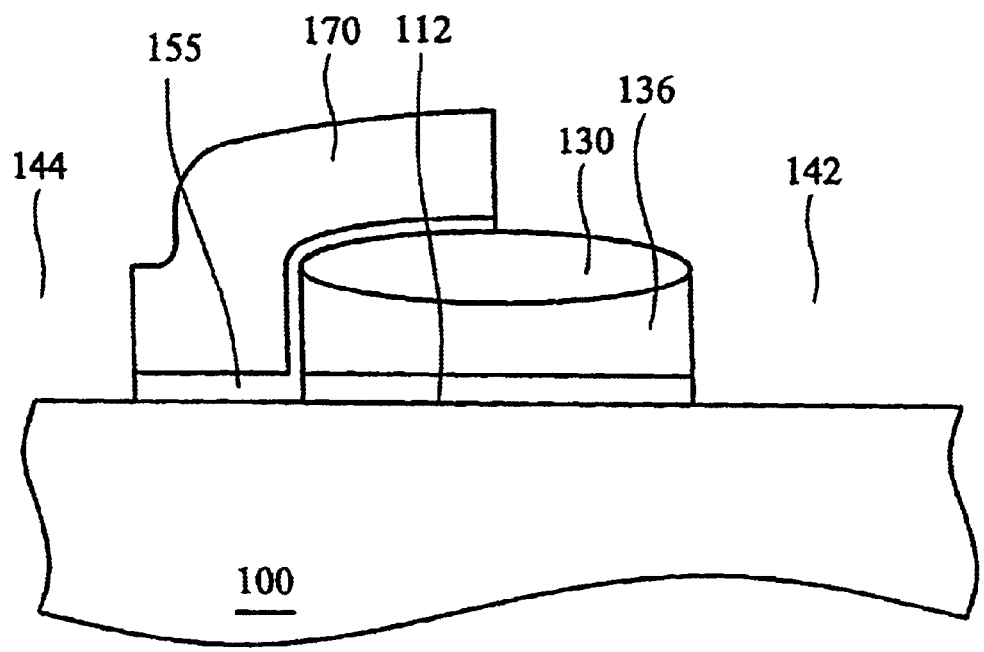
Figure 1G:
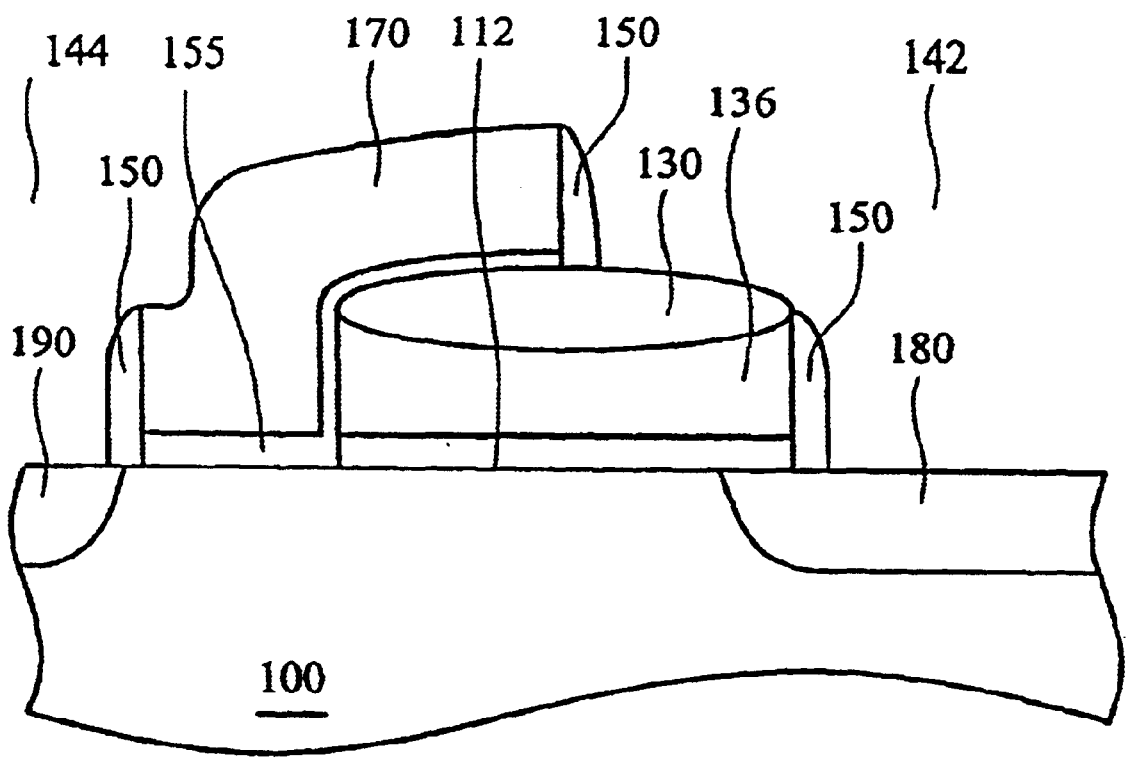
Figure 2A:
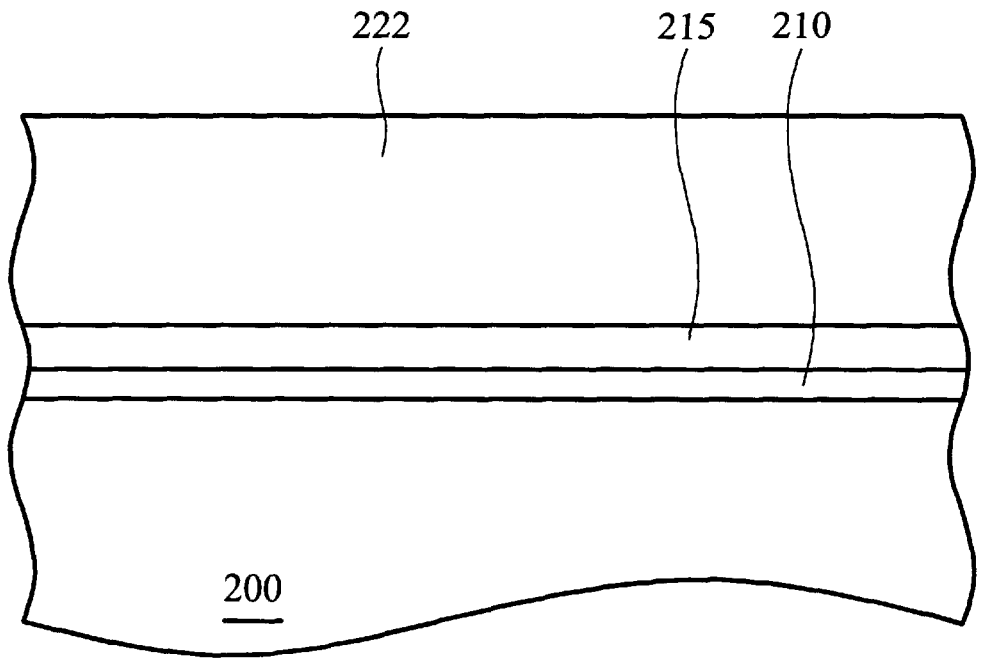
FIGS. 2A through 2H illustrate, in cross section, the process in accordance with the present invention.

As shown in FIG. 2A, a semiconductor substrate 200, for example, a p-type silicon substrate, is provided. By using LOCOS or STI technique, a field insulating layer (not shown) is formed to define the active area (not shown) on the substrate 200. A first insulating layer 210 is formed on the substrate 200 within the active area. The first insulating layer 210 can be made of oxide formed by oxidation and has a thickness of from 50 to 200 angstroms. Then, a first conductive layer 215, which has a thickness of about 100 to 1000 angstroms, is formed on the first insulating layer 210.

The first conductive layer 215 is usually made of doped polycrystalline silicon formed by CVD. The first conductive layer 215 can be doped by phosphorus ions or arsenic ions by diffusion, implantation or in-situ doping. A buffer layer 220, with a thickness of about 500 to 2000 angstroms, is formed on the first conductive layer 215. The buffer layer 220 can be made of oxide and is formed by low pressure chemical vapor deposition (LPCVD) or thermal oxidation technique.

Figure 2B:
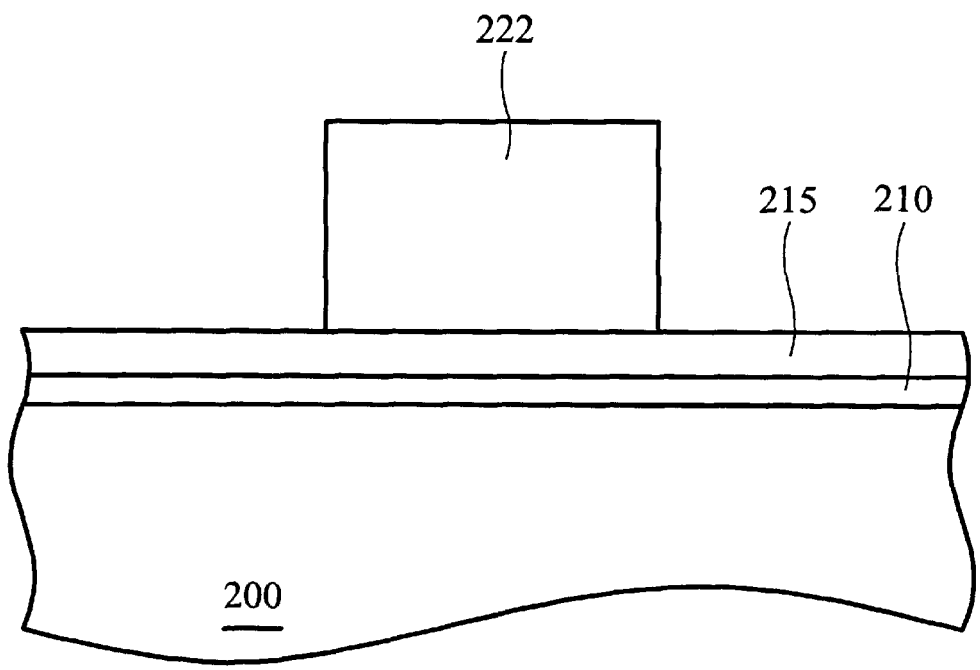

As shown in FIG. 2B, portions of the buffer layer 220 are removed by photolithography and etching. The remaining buffer layer 220 forms a floating gate insulating layer 222.

Figure 2C:
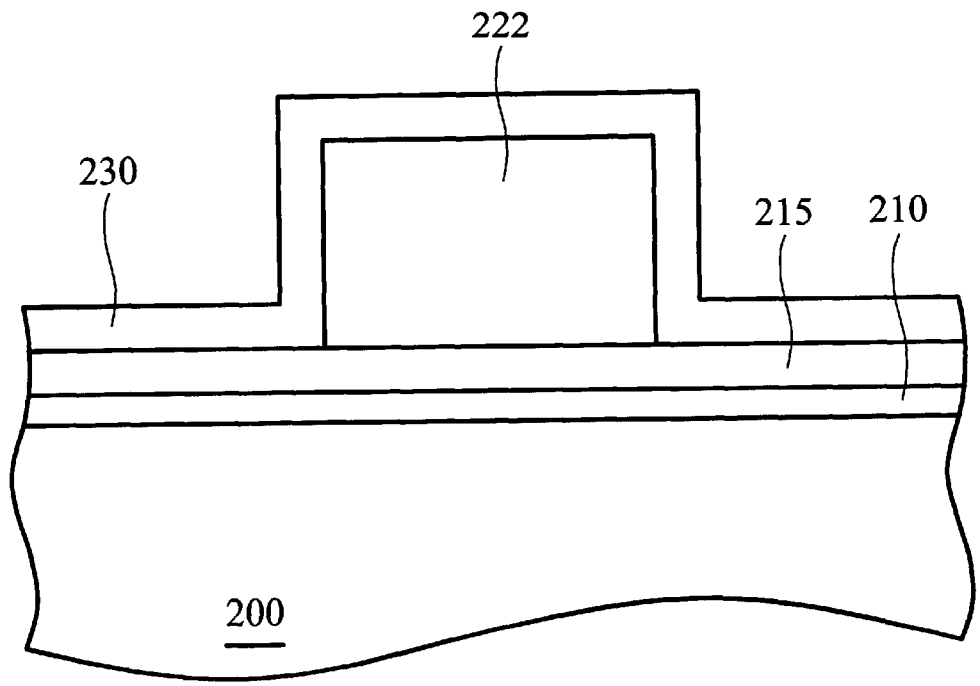

As shown in FIG. 2C, a second conductive layer 230 is formed on the surface of the first conductive layer 215 and the floating gate insulating layer 222. The second conductive layer 230 has a thickness of about 100 to 500 angstroms and is usually made of the doped polycrystalline silicon formed by LPCVD. The second conductive layer 230 can be doped by the phosphorus ions or arsenic ions by diffusion, implantation or in-situ doping.

Figure 2D:
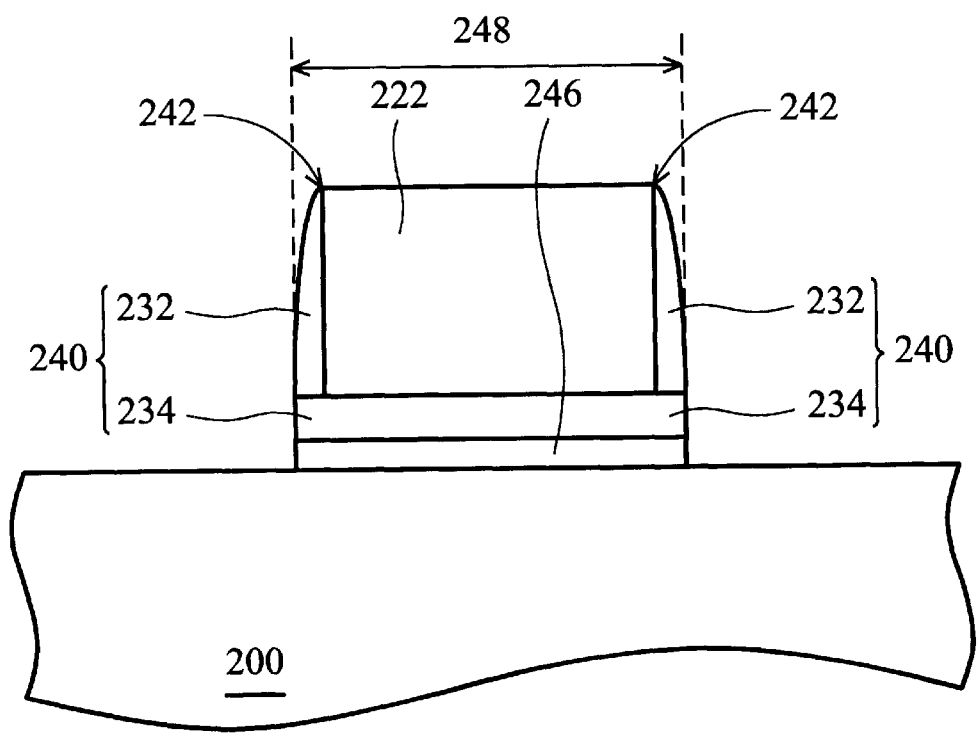

As shown in FIG. 2D, portions of the first conductive layer 215 and the second conductive layer 230 are removed by etching, such as anisotropic etching. Afterwards, the second conductive layer 230 remaining on the sidewalls of the floating gate insulating layer 222 becomes conductive first spacers 232, and then, the first conductive layer 215 remaining under the conductive spacers 232 and under the floating gate insulating layer 222 becomes a composite conductive layer 234. The conductive spacers 232 and the conductive layer 234 are combined as a floating gate 240. Then, portions the first insulating layer 210 uncovered by the floating gates 240 are removed by etching, such as anisotropic etching. The remaining first insulating layer 210 will be referred to as a first gate insulating layer 246 hereafter. Conductive tips 242 situated at the tip of the conductive spacers 232 are used for tip discharging when flash memory is erasing. The floating gate insulating layer 222, the floating gate 240 and the first gate insulating layer 246 will be referred to as a floating gate region 248 hereafter.

Figure 2E:
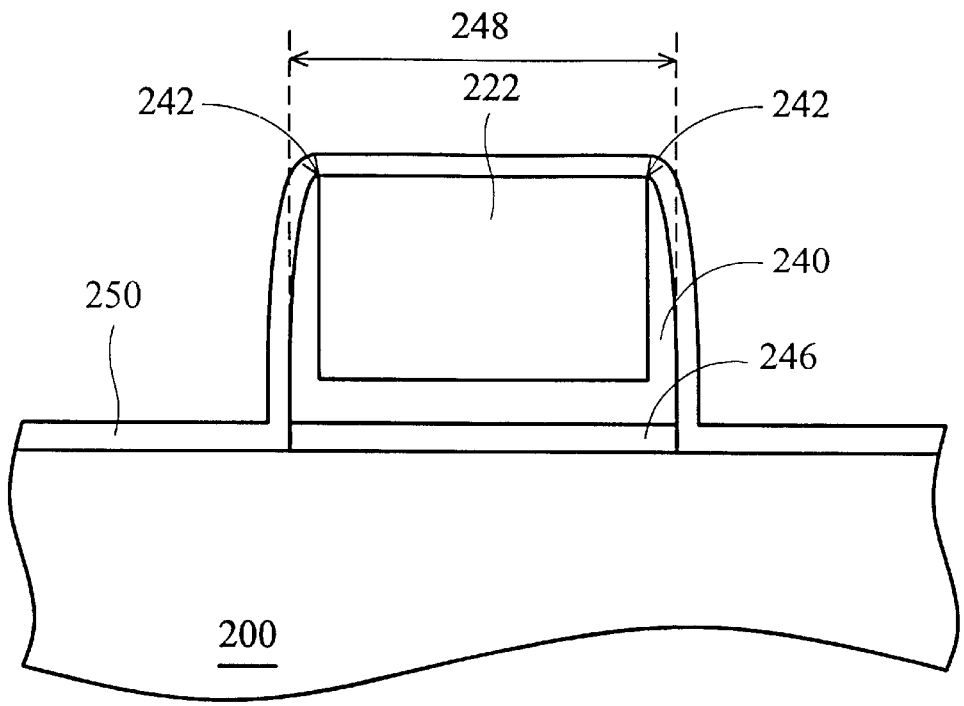

As shown in FIG. 2E, a second insulating layer 250 is formed on the surface of the floating gate region 248 and the substrate 200. The second insulating layer 250, which has a thickness of about 50 to 250 angstroms, is an oxide and is formed by CVD.

Figure 2F:
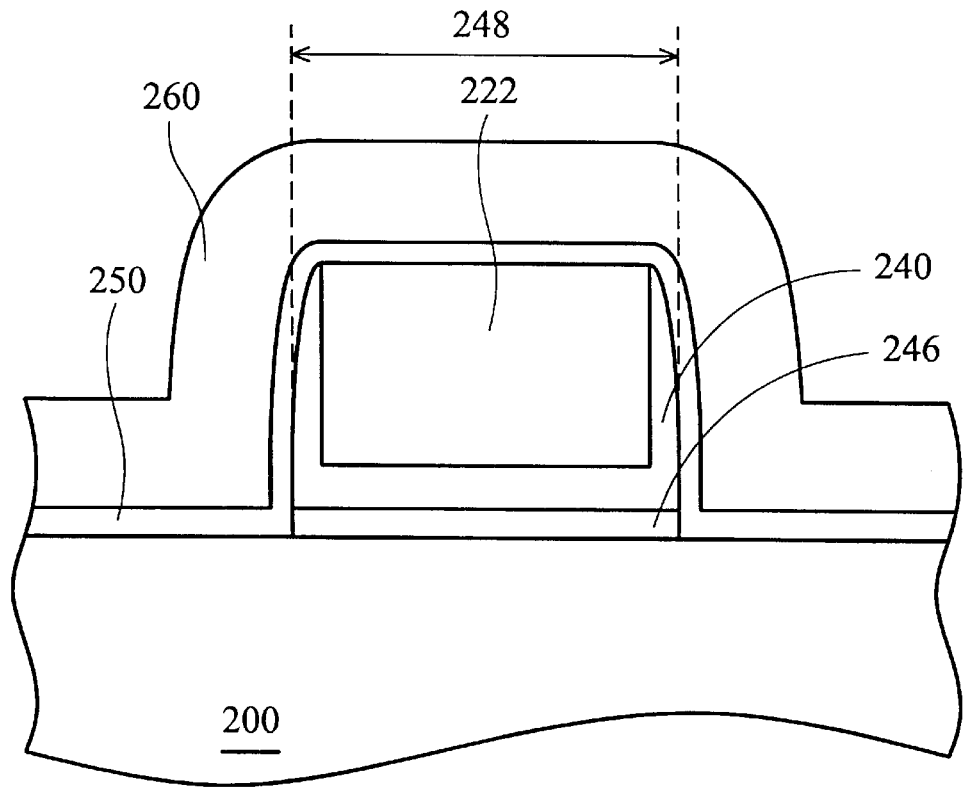

As shown in FIG. 2F, a third conductive layer 260 is formed on the second insulating layer 250. The third conductive layer 260 has a thickness of about 1000 to 2000 angstroms and is usually made of the doped polycrystalline silicon formed by LPCVD. The third conductive layer 260 can be doped by the phosphorus ions or arsenic ions by diffusion, implantation or in-situ doping.

Figure 2G:
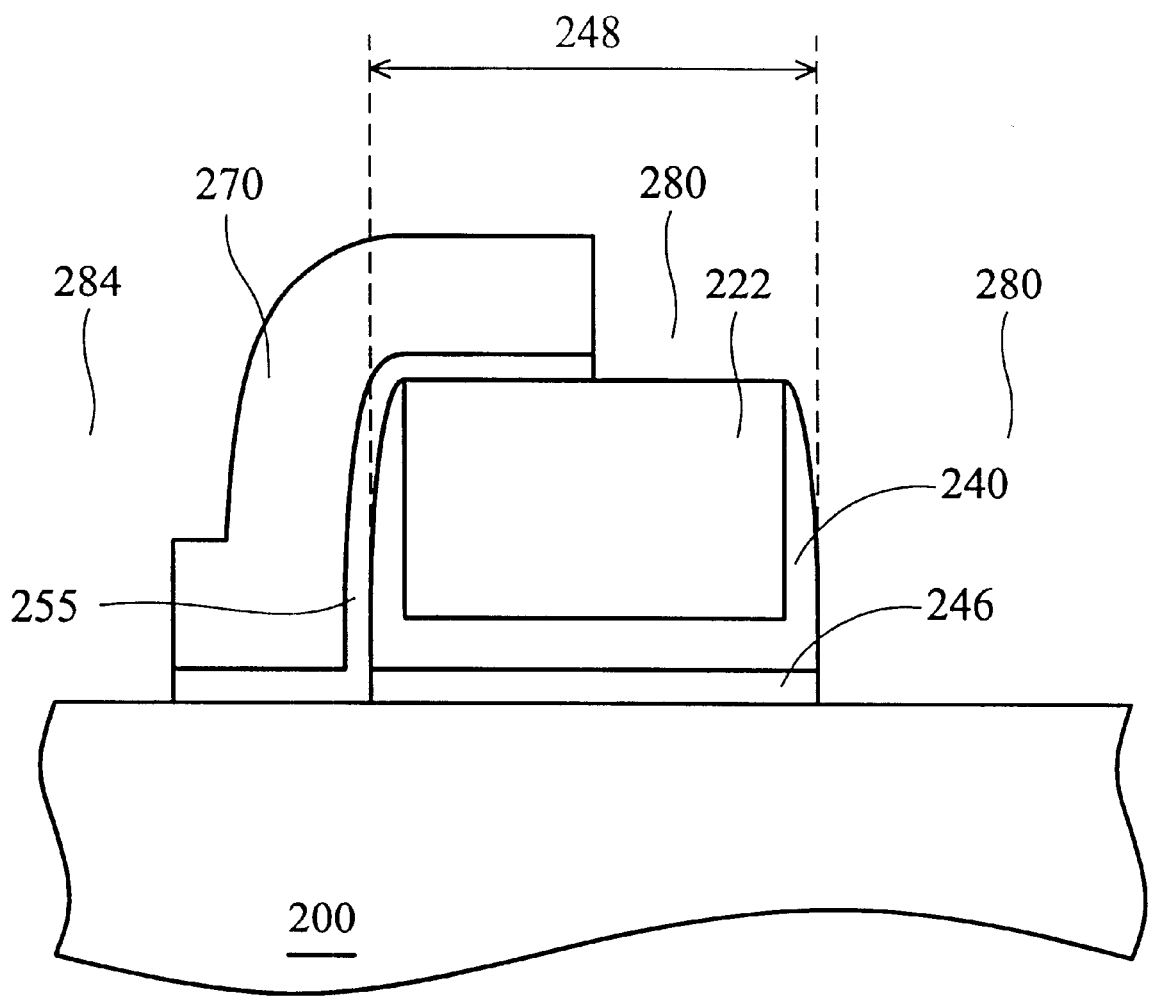

As shown in FIG. 2G, portions of the third conductive layer 260 and the second insulating layer 250 are removed by photolithography and etching to form a first opening 280 and a second opening 284. The remaining third conductive layer 260 forms the control gate 270. The remaining second insulating layer 250 will be expressed as a second gate insulating layer 255.

Figure 2H:
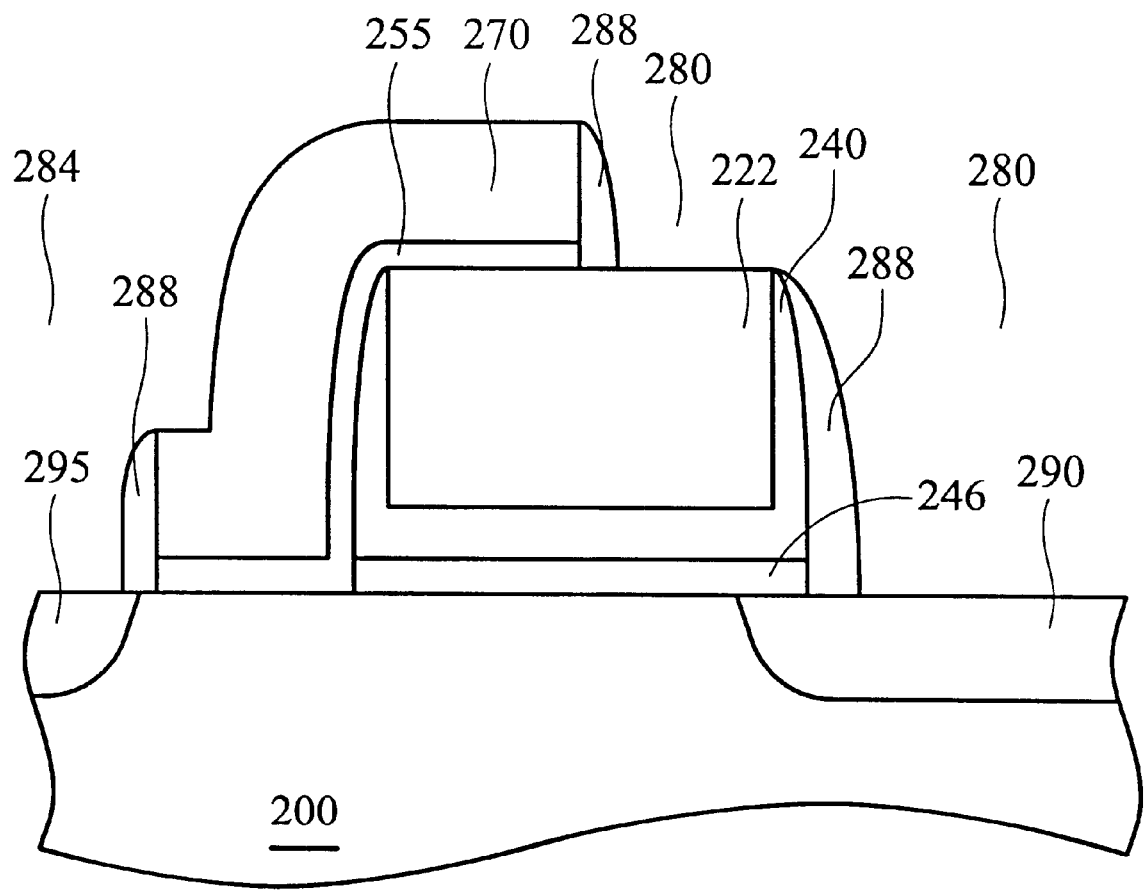

As shown in FIG. 2H, a source region 290 is formed on the exposed substrate 200 by implanting N-type ions, such as phosphorus or arsenic into the substrate 200, which is exposed in the first opening 280. Then, an insulating layer (not shown) is formed to cover the surface and the sidewalls of the control gate 270, the sidewalls of the second gate insulating layer 255 and the first gate insulating layer 246, and the surface and the sidewalls of the floating gate region 248. The insulating layer can be made of an oxide. Etching is performed to remove portions of the insulating layer and form the insulating sidewall second spacers 288 on the sidewalls of the first opening 280 and the second opening 284. A drain region 295 is formed on the exposed substrate 200 by implanting N-type ions, such as phosphorus or arsenic into the substrate 200, which is exposed in the second opening 284. The manufacture of a cell of flash memory is thus completed.

It is to be understood that the present invention is not limited to the embodiments described above, but encompasses any and all embodiments within the scope of the following claims.

What is claimed is:

1. A method of fabricating a split-gate flash memory cell, comprising the steps of:

providing a semiconductor substrate;

defining an active area on the substrate;

forming a first insulating layer as a first gate insulating layer within the active area;

forming a first conductive layer on the first gate insulating layer;

forming a buffer layer on the first conductive layer;

removing portions of the buffer layer to form a floating gate insulating layer;

forming a second conductive layer on the surface of the first conductive layer and the floating gate insulating layer;

removing portions of the first conductive layer and the second conductive layer, such that the second conductive layer remaining on the sidewalls of the floating gate insulating layer forms conductive first spacers having conductive tips situated at the tips, the first conductive layer remaining under the conductive spacers and under the floating gate insulating layer forms a composite conductive layer, the conductive spacers and the composite conductive layer are combined as a floating gate, wherein the conductive tips are suitable for tip discharging, and the floating gate insulating layer, the floating gate and the first gate insulating layer are combined as a floating gate region;

forming a second insulting layer on the surface of the floating gate region and the substrate;

forming a third conductive layer on the second insulating layer;

removing portions of the third conductive layer and the second insulating layer to form a first opening and a second opening, such that the remaining third conductive layer forms the control gate and the remaining second insulating layer forms the second gate insulating layer;

forming a source region by implanting impurity ions through the first opening into the substrate;

forming insulating second spacers on the sidewalls of the first opening and the second opening; and forming a drain region on the substrate within the second opening.

2. The method as recited in claim 1, wherein the semiconductor substrate is a silicon substrate.

3. The method as recited in claim 1, wherein the first gate insulating layer is made of oxide formed by oxidation.

4. The method as recited in claim 1, wherein the first gate insulating layer has a thickness of 50 to 200 angstroms.

5. The method as recited in claim 1, wherein the first conductive layer is made of doped polycrystalline silicon.

6. The method as recited in claim 1, wherein the first conductive layer has a thickness of 100 to 1000 angstroms.

7. The method as recited in claim 1, wherein the buffer layer is made of oxide.

8. The method as recited in claim 7, wherein the buffer layer has a thickness of 500 to 2000 angstroms.

9. The method as recited in claim 1, wherein the second conductive layer is made of doped polycrystalline silicon.

10. The method as recited in claim 9, wherein the second conductive layer has a thickness of 100 to 500 angstroms.

11. The method as recited in claim 1, wherein the second insulating layer is made of oxide formed by chemical vapor deposition (CVD).

12. The method as recited in claim 1, wherein the second insulating layer has a thickness of 50 to 250 angstroms.

13. The method as recited in claim 1, wherein the third conductive layer is made of doped polycrystalline silicon.

14. The method as recited in claim 1, wherein the third conductive layer has a thickness of 1000 to 2000 angstroms.

* * * * *